US 8,441,378 B2

(12) United States Patent
Souchkov

(10) Patent No.: US 8,441,378 B2
(45) Date of Patent: May 14, 2013

(54) CAPACITOR MISMATCH ERROR CORRECTION IN PIPELINE ANALOG-TO-DIGITAL CONVERTERS

(75) Inventor: Vitali Souchkov, Walnut Creek, CA (US)

(73) Assignee: Pixart Imaging, Inc., Hsin-Chu (TW)

( * ) Notice: Subject to any disclaimer, the term of this patent is extended or adjusted under 35 U.S.C. 154(b) by 119 days.

(21) Appl. No.: 13/222,886

(22) Filed: Aug. 31, 2011

(65) Prior Publication Data
US 2013/0038477 A1  Feb. 14, 2013

Related U.S. Application Data

(63) Continuation-in-part of application No. 13/208,318, filed on Aug. 11, 2011.

(51) Int. Cl.
*H03M 1/06*  (2006.01)
(52) U.S. Cl.
USPC ............ 341/118; 341/119; 341/117; 341/161
(58) Field of Classification Search .......... 341/117–120, 341/161, 155
See application file for complete search history.

(56) References Cited

U.S. PATENT DOCUMENTS

| | | | | |
|---|---|---|---|---|
| 4,894,656 | A | * | 1/1990 | Hwang et al. ................. 341/120 |
| 5,499,027 | A | * | 3/1996 | Karanicolas et al. ......... 341/120 |
| 5,638,071 | A | * | 6/1997 | Capofreddi et al. .......... 341/118 |
| 6,184,809 | B1 | | 2/2001 | Yu |
| 6,456,223 | B1 | * | 9/2002 | Yu et al. ........................ 341/161 |
| 6,617,992 | B2 | | 9/2003 | Sakurai |
| 6,710,735 | B1 | * | 3/2004 | Lin ................................ 341/161 |
| 6,734,818 | B2 | | 5/2004 | Galton |
| 6,784,814 | B1 | * | 8/2004 | Nair et al. ..................... 341/118 |
| 6,894,631 | B1 | * | 5/2005 | Bardsley ....................... 341/120 |

(Continued)

FOREIGN PATENT DOCUMENTS

| | | |
|---|---|---|
| CN | 101777917 | 7/2010 |
| EP | 0930715 | 7/1999 |

OTHER PUBLICATIONS

Bernal, O. et al., "Digitally Self-Calibrated Pipelined Analog-to-Digital Converter", IMTC 2006 Instrumentation and Measurement Technology Conference, Sorrento, Italy: 0-7803-9360-0/06/$20.00 C2006 *IEEE* Apr. 24-27, 2006.

(Continued)

*Primary Examiner* — Jean B Jeanglaude
(74) *Attorney, Agent, or Firm* — McClure, Qualey & Rondack, LLP

(57) ABSTRACT

Various embodiments of methods and devices for reducing capacitor mismatch errors in a pipeline analog-to-digital converter (ADC) are disclosed. A plurality of pipeline element circuits are provided, where each pipeline element circuit corresponds to a given bit of the pipeline ADC. A first pipeline element circuit is configured to digitize analog A and B capacitor mismatch error calibration voltages generated by all the pipeline element circuits of the ADC when the pipeline ADC is operating in a capacitor mismatch calibration phase. According to one embodiment, digital representations corresponding to A and B capacitor mismatch error calibration voltages for each of the pipeline element circuits are provided to an output shift register and summing circuit, which generates capacitor mismatch error correction codes corresponding to each bit and pipeline element circuit. The capacitor mismatch error correction codes are applied to each bit weight of the pipeline ADC after conversion of analog signals input to the pipeline ADC has been completed.

36 Claims, 13 Drawing Sheets

U.S. PATENT DOCUMENTS

| | | | |
|---|---|---|---|
| 7,030,804 B2 | 4/2006 | Yoshioka et al. | |
| 7,312,732 B2 * | 12/2007 | Engl | 341/118 |
| 7,612,703 B2 | 11/2009 | Chen et al. | |
| 2003/0184459 A1 * | 10/2003 | Engl | 341/120 |

OTHER PUBLICATIONS

Chen, Hsin-Shu et al., "A 14-b 20-MSamples/s CMOS Pipelined ADC", *IEEE Journal of Solid-State Circuits*, vol. 36, No. 6 Jun. 2001.

Chiu, Yun, "Inherently Linear Capacitor Error-Averaging Techniques for Pipelined A/D Conversion", <http://ieeexplore.ieee.org/xpl/freeabsall.jsp?arnumber=826750> Mar. 2000, 229-232, vol. 47.

Chuang, Shang-Yuan (Sean), "A Digitally Self-Calibrating 14-bit 10-MHz CMOS Pipelined A/D Converter", *IEEE Journal of Solid-State Circuits*, vol. 37, No. 6. Jun. 2002.

El-Sankary, et al., "A Digital Blind Background Capacitor Mismatch Calibration Technique for Pipelined ADC", *IEEE Transactions on Circuits and Systems*, V.51, N10 Oct. 2004.

Keane, John P. et al., "Background Interstage Gain Calibration Technique for Pipelined ADCs", *IEEE Transactions on Circuits and Systems-I: Regular Papers*, vol. 52, No. 1. Jan. 2005.

Lewis, Stephen H. et al., "A 10-b 20-Msample/s Analog-to-Digital Converter", *IEEE Journal of Solid-State Circuits*, vol. 27, No. 3 Mar. 1992.

Myers, Charles et al., "Low Voltage High-SNR Pipeline Data Converters", 0-7803-8322-2/04/$20.00 c2004 *IEEE* 2004.

Opris, Ion E. et al., "A Single-Ended 12-bit 20 Msample/s Self-Calibrating Pipeline A/D Converter", *IEEE Journal of Solid-State Circuits*, vol. 33, No. 12 Dec. 1998.

Rombouts, P. et al., "A Digital Error-Averaging Technique for Pipelined A/D Conversion", <http://ieeexplore.ieee.org/xpl/freeabsall.jsp?arnumber=718603> Sep. 1998, 1321-1323, vol. 45.

Taherzadeh-Sani, Mohammad et al., "Digital Background Calibration of Capacitor-Mismatch Errors in Pipelined ADCs", <http://www.ece.mcgill.ca/~ahamou1/FILES/PUBLICATIONS/01705076.pdf> Sep. 2006, vol. 53.

\* cited by examiner

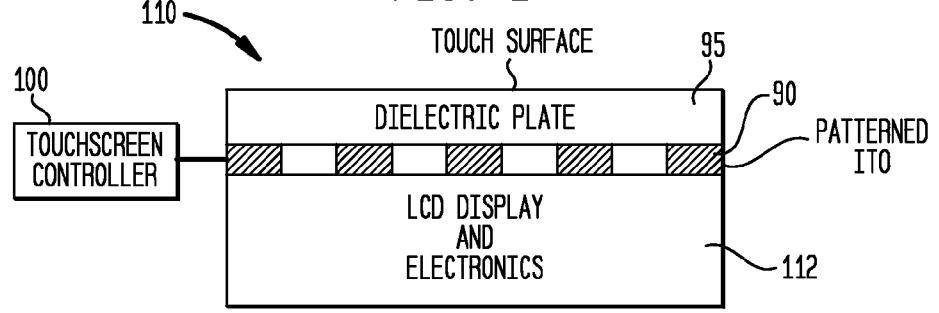
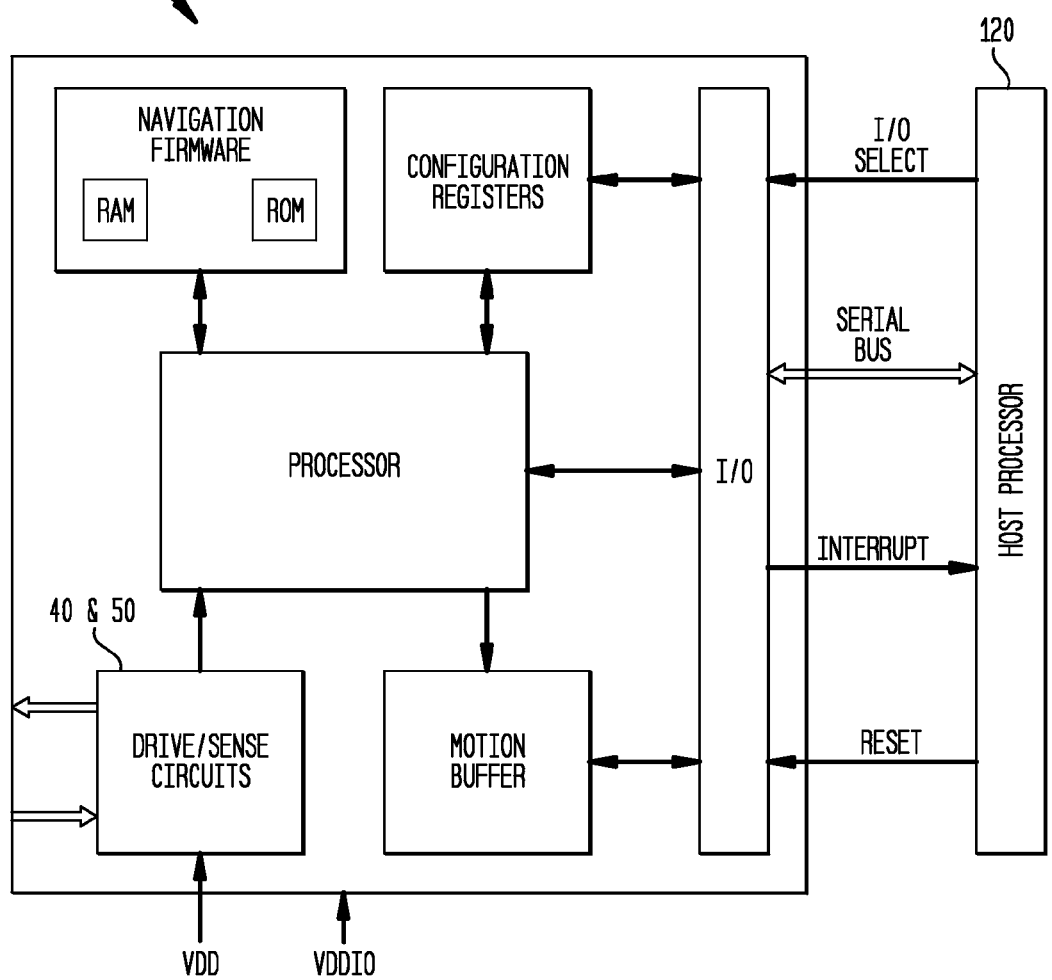

BEFORE CALIBRATION

4 BITS CALIBRATED

5 BITS
CALIBRATED

FIG. 14

| PIPE BIT NUMBER | $\frac{\varphi C}{C}$, % RMS | HISTOGRAM 100 EVENTS, 14 BIT RESOLUTION | STANDARD DEVIATION, COUNTS |
|---|---|---|---|
| 11 | 0.0702 | CORRECTION COUNT0 DISTRIBUTION DIGITIZED WITH 14 BIT RESOLUTION | 6.08422 |
| 10 | 0.0860 | CORRECTION COUNT1 DISTRIBUTION DIGITIZED WITH 14 BIT RESOLUTION | 7.36835 |
| 9 | 0.1217 | CORRECTION COUNT2 DISTRIBUTION DIGITIZED WITH 14 BIT RESOLUTION | 10.8276 |
| 8 | 0.1723 | CORRECTION COUNT3 DISTRIBUTION DIGITIZED WITH 14 BIT RESOLUTION | 13.6301 |

CAPACITOR MISMATCH ERROR CORRECTION IN PIPELINE ANALOG-TO-DIGITAL CONVERTERS

RELATED APPLICATION

This application is a continuation-in-part of, and claims priority and other benefits from, U.S. patent application Ser. No. 13/208,318 filed Aug. 11, 2001, 2011 entitled "Systems, Devices and Methods for Capacitor Mismatch Error Averaging in Pipeline Analog-to-Digital Converters" to Souchkov (hereafter "the '318 patent application"), the entirety of which is hereby incorporated by reference herein.

FIELD OF THE INVENTION

Various embodiments of the invention described herein relate to the field of analog-to-digital converters (ADCs) generally, and also to the field of ADCs incorporated into touchscreen, touchpad and/or touch panel controllers.

BACKGROUND

Increasing bit resolution in digital imaging applications for navigation (such as in capacitive touch screen integrated controllers, or in integrated optical imagers in OFN/mice) generally requires that steps be taken during the design phase to address problems arising from mismatches between integrated components in ADCs. Pipeline ADC architecture is frequently used in imaging applications because of its ability to simultaneously process multiple elements in imaging data arrays. In metal oxide silicon (MOS) pipeline ADCs and the integrated circuits into which they are incorporated, the most critical components to match are often the capacitors in the multiplication digital-to-analog converters (DACs) of each pipeline element. Capacitors, and especially large capacitors, can require large amounts of area on an integrated circuit, and may be difficult to design and implement when the effective number of bits (ENOB) in the ADC equals or exceeds 12. In addition, large capacitors can significantly increase the amount of power consumed by the ADC.

Numerous error calibration techniques have therefore been proposed with the aim of achieving high ENOB while not consuming excessive integrated circuit real estate and ADC power. Radix digital calibration techniques typically require substantial digital manipulation and prolonged reiterations during digital calibration. Analog averaging of active and passive capacitors is another technique that has been used to increase the ENOB of pipeline ADCs, but which typically requires extra amplifiers and/or extra capacitors. In addition, an averaging clock phase, in addition to normal clock operations, is also typically required. These requirements add to integrated circuit size, design complexity, and also increase the ADC power consumption.

Some publications discussing the foregoing problems include, but are not limited to: P. Rombouts et al., IEEE Transactions on Circuits and Systems, V.45, N9, September 1998; EI-Sankary et al., IEEE Transactions on Circuits and Systems, V.51, N10, October 2004; Sean Chang, et. al., IEEE Journal of Solid State Circuits, V.37, N6, June 2002; Stephen H. Lewis, et. al., IEEE Journal of Solid State Circuits, V.27, N3, March 1992; John P. Keane, et. al., IEEE Journal on Circuits and Systems, V.52, N1, January 2005; 0. Bernal, et al., IMTC 2006 Technology Conference, Sorrento, Italy, Apr. 24-27, 2006; Ion P. Opris, et. al., IEEE Journal of Solid State Circuits, V.33, N12, December 1998; Dong-Young Chang, et. al., IEEE Transactions on Circuits and Systems, V.51, N11, November 2004; Yun Chiu, et. al., IEEE Journal of Solid State Circuits, V.39, N12, December 2004, and Hsin-Shu Chen, IEEE Journal of Solid State Circuits, V.36, N6, June 2001. Each of the foregoing references is hereby incorporated by reference herein, each in its respective entirety.

What is needed is a pipeline ADC featuring reduced capacitor mismatch errors, smaller capacitors, and lower ADC power consumption

SUMMARY

In one embodiment, there is provided a pipeline analog-to-digital converter (ADC) comprising a plurality of pipeline element circuits, each pipeline element circuit corresponding to a given bit of the pipeline ADC and comprising an amplifier circuit switchably configured to operate in first A and second B capacitor configurations corresponding, respectively, to a first A capacitor and a second B capacitor, a first pipeline element circuit comprising a calibration sample-and-hold circuit operably connected thereto, the first pipeline element circuit being configured to digitize analog A and B capacitor mismatch error calibration voltages generated by the first pipeline element circuit and by the remainder of the pipeline element circuits when the pipeline ADC is operating in a capacitor mismatch calibration phase, the first pipeline element circuit further being configured to provide as outputs therefrom digital representations corresponding to the A and B capacitor mismatch error calibration voltages for each of the plurality of pipeline element circuits during the capacitor mismatch calibration phase, an output shift register and summing circuit configured to receive and process the digital representations to provide capacitor mismatch error correction codes corresponding to each bit and pipeline element circuit, and a memory one of forming a portion and not forming a portion of the pipeline ADC configured to receive and store therein the capacitor mismatch error correction codes corresponding to each bit and pipeline element circuit of the pipeline ADC, wherein the capacitor mismatch error correction codes are applied to each bit weight of the pipeline ADC after conversion of analog signals-input to the pipeline ADC has been completed.

In another embodiment, there is provided a method of reducing capacitor mismatch errors in a pipeline analog-to-digital converter (ADC), the pipeline ADC comprising a plurality of pipeline element circuits, each pipeline element circuit corresponding to a given bit of the pipeline ADC and comprising an amplifier circuit switchably configured to operate in first A and second B capacitor configurations corresponding, respectively, to a first A capacitor and a second B capacitor, a first pipeline element circuit comprising a calibration sample-and-hold circuit operably connected thereto, the first pipeline element circuit being configured to digitize analog A and B capacitor mismatch error calibration voltages generated by the first pipeline element circuit and by the remainder of the pipeline element circuits when the pipeline ADC is operating in a capacitor mismatch calibration phase, the first pipeline element circuit further being configured to provide as outputs therefrom digital representations corresponding to the A and B capacitor mismatch error calibration voltages for each of the plurality of individual pipeline element circuits during the capacitor mismatch calibration phase, the method comprising digitizing the A and B analog capacitor mismatch error calibration voltages generated by the pipeline element circuits, generating the digital representations corresponding to the A and B capacitor mismatch error calibration voltages for each of the plurality of pipeline element circuits, and generating in an output shift register and summing circuit the A and B capacitor mismatch error correction codes corresponding to each bit and pipeline element circuit.

Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

FIG. 1 shows a cross-sectional view of one embodiment of a capacitive touchscreen system;

FIG. 2 shows a block diagram of a capacitive touchscreen controller;

FIG. 14 shows correction code distributions for a pilot ADC design.

The drawings are not necessarily to scale. Like numbers refer to like parts or steps throughout the drawings.

DETAILED DESCRIPTIONS OF SOME EMBODIMENTS

Figure 3:
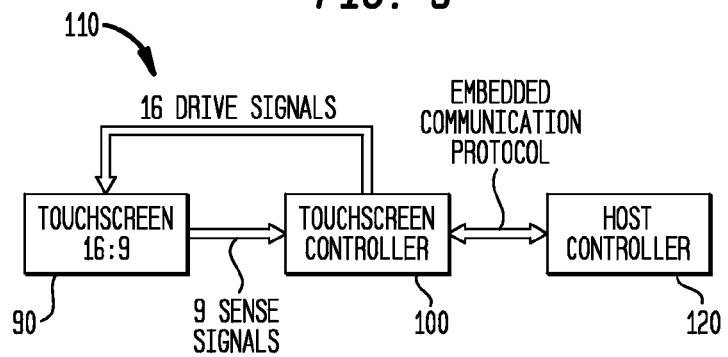
FIG. 3 shows one embodiment of a block diagram of a capacitive touchscreen system and a host controller.

As illustrated in FIG. 1, a capacitive touchscreen system 110 typically consists of an underlying LCD or OLED display 112, an overlying touch-sensitive panel or touchscreen 90, a protective cover or dielectric plate 95 disposed over the touchscreen 90, and a touchscreen controller, micro-processor, application specific integrated circuit ("ASIC") or CPU 100. Note that image displays other than LCDs or OLEDs may be disposed beneath touchscreen 90.

FIG. 2 shows a block diagram of one embodiment of a touchscreen controller 100. In one embodiment, touchscreen controller 100 may be an Avago Technologies™ AMRI-5000 ASIC or chip 100 modified in accordance with the teachings presented herein. In one embodiment, touchscreen controller is a low-power capacitive touch-panel controller designed to provide a touchscreen system with high-accuracy, on-screen navigation.

Figure 4:
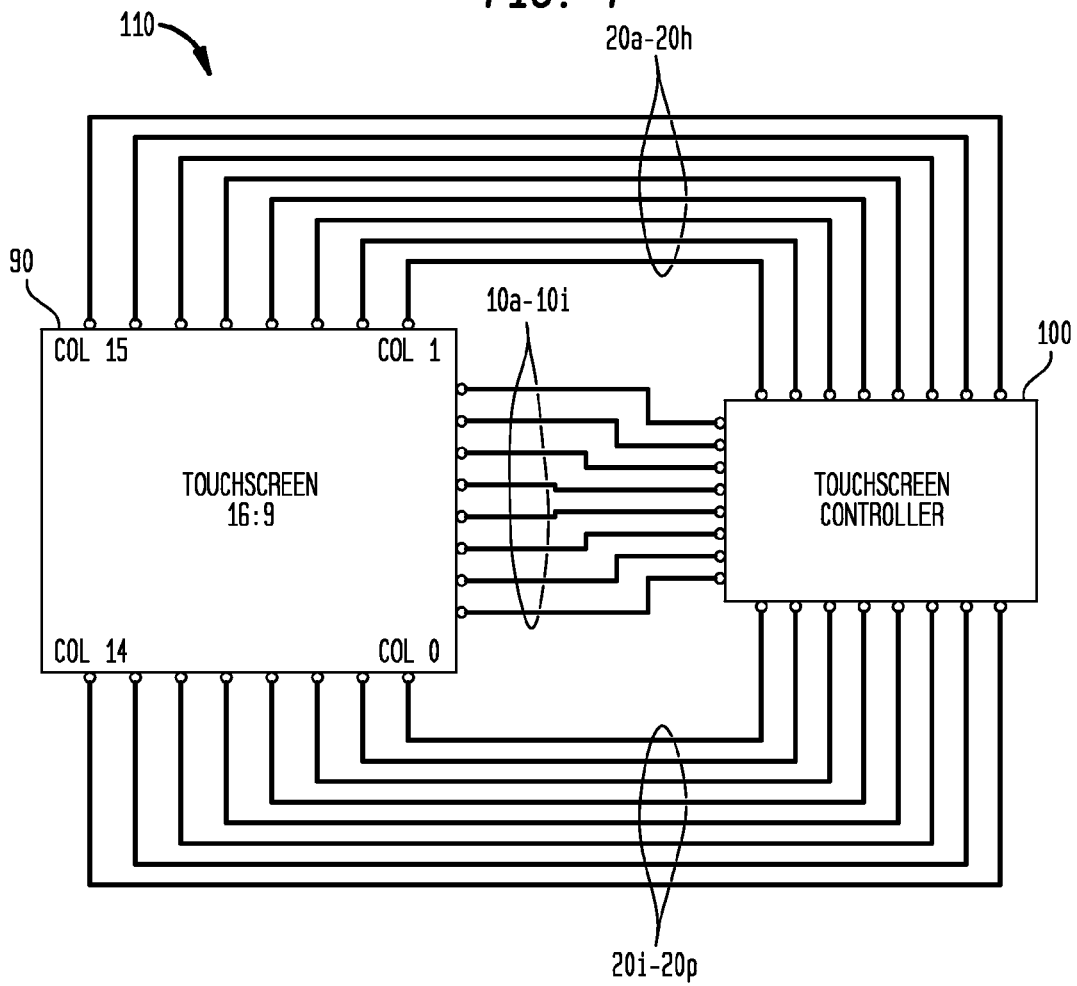
FIG. 4 shows a schematic block diagram of one embodiment of a capacitive touchscreen system.

Capacitive touchscreens or touch panels 90 shown in FIGS. 3 and 4 can be formed by applying a conductive material such as Indium Tin Oxide (ITO) to the surface(s) of a dielectric plate, which typically comprises glass, plastic or another suitable electrically insulative and preferably optically transmissive material, and which is usually configured in the shape of an electrode grid. The capacitance of the grid holds an electrical charge, and touching the panel with a finger presents a circuit path to the user's body, which causes a change in the capacitance.

Touchscreen controller 100 senses and analyzes the coordinates of these changes in capacitance. When touchscreen 90 is affixed to a display with a graphical user interface, on-screen navigation is possible by tracking the touch coordinates. Often it is necessary to detect multiple touches. The size of the grid is driven by the desired resolution of the touches. Typically there is an additional cover plate 95 to protect the top ITO layer of touchscreen 90 to form a complete touch screen solution (see, e.g., FIG. 1).

One way to create a touchscreen 90 is to apply an ITO grid on one side only of a dielectric plate or substrate. When the touchscreen 90 is mated with a display there is no need for an additional protective cover. This has the benefit of creating a thinner display system with improved transmissivity (>90%), enabling brighter and lighter handheld devices. Applications for touchscreen controller 100 include, but are not limited to, smart phones, portable media players, mobile internet devices (MIDs), and GPS devices.

Referring now to FIGS. 3 and 4, in one embodiment the touchscreen controller 100 includes an analog front end with 16 drive signal lines and 9 sense lines connected to an ITO grid on a touchscreen. Touchscreen controller 100 applies an excitation such as a square wave, meander signal or other suitable type of drive signal to the drive electrodes that may have a frequency selected from a range between about 40 kHz and about 200 kHz. The AC signal is coupled to the sense lines via mutual capacitance. Touching touchscreen or touch panel 90 with a finger alters the capacitance at the location of the touch. Touchscreen controller 100 can resolve and track multiple touches simultaneously. A high refresh rate allows the host to track rapid touches and any additional movements without appreciable delay. The embedded processor filters the data, identifies the touch coordinates and reports them to the host. The embedded firmware can be updated via patch loading. Other numbers of drive and sense lines are contemplated, such as 8×12 and 12×20 arrays.

Touchscreen controller 100 may feature multiple operating modes with varying levels of power consumption. In rest mode controller 100 may be configured to look periodically for touches at a rate programmed by the rest rate registers. Multiple rest modes may be employed, each with successively lower power consumption. In the absence of a touch for a certain interval, controller 100 may be configured to shift automatically to the next-lowest power consumption mode.

According to one embodiment, and as shown in FIG. 4, an ITO grid or other electrode configuration on touchscreen 90 comprises sense columns 20a-20p and drive rows 10a-10i, where sense columns 20a-20p are operably connected to corresponding sense circuits and rows 10a-10i are operably connected to corresponding drive circuits. One configuration for routing ITO or other drive and sense electrodes to lines to touchscreen controller 100 is shown in FIG. 4.

Those skilled in the art will understand that touchscreen controllers, micro-processors, ASICs or CPUs other than a modified AMRI-5000 chip or touchscreen controller 100 may be employed in touchscreen system 110, and that different numbers of drive and sense lines, and different numbers and configurations of drive and sense electrodes, other than those explicitly shown herein may be employed without departing from the scope or spirit of the various embodiments of the invention.

Figure 5:
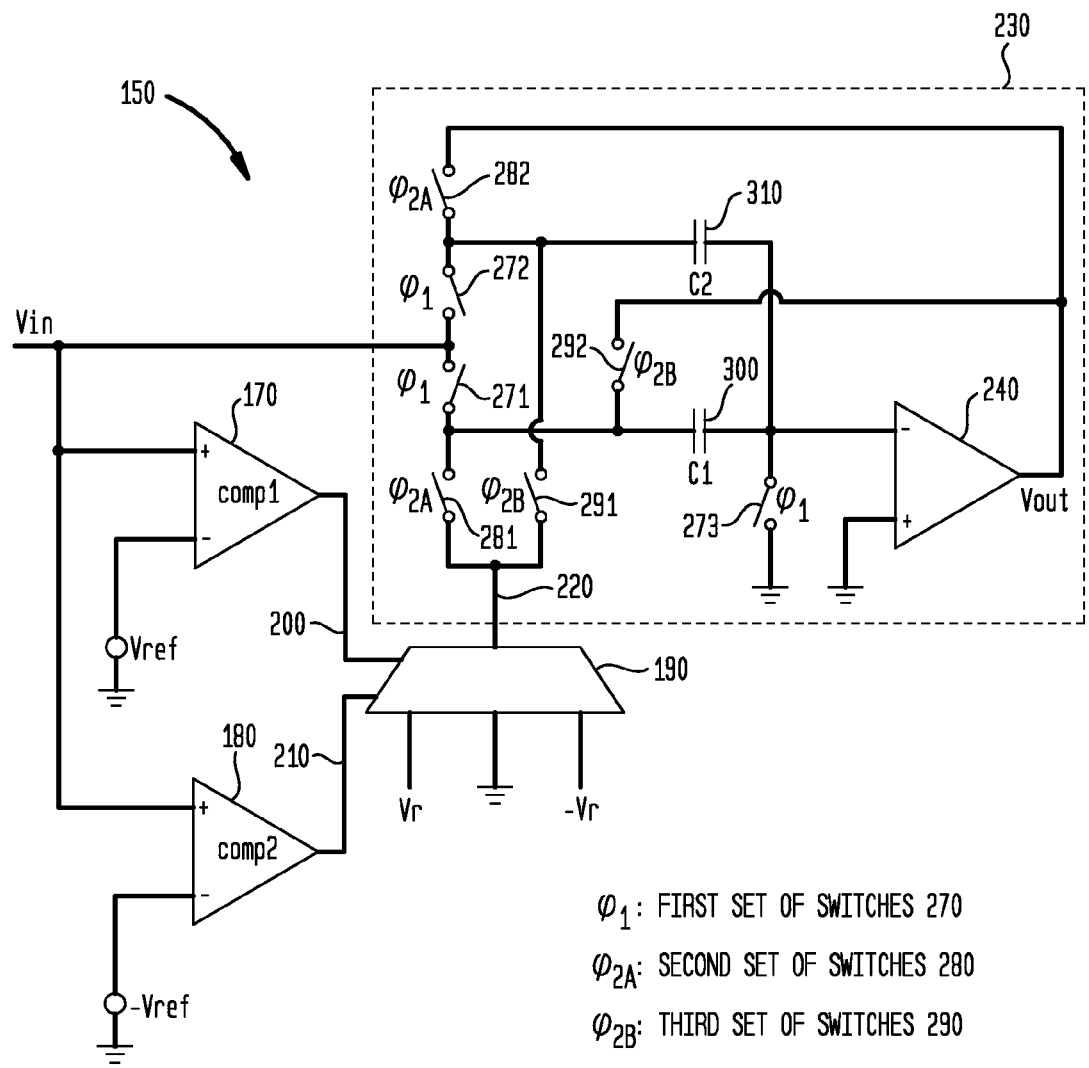
FIG. 5 shows one embodiment of a single pipeline element circuit 150 according to one embodiment of pipeline analog-to-digital converter (ADC) 155.
Figure 6:
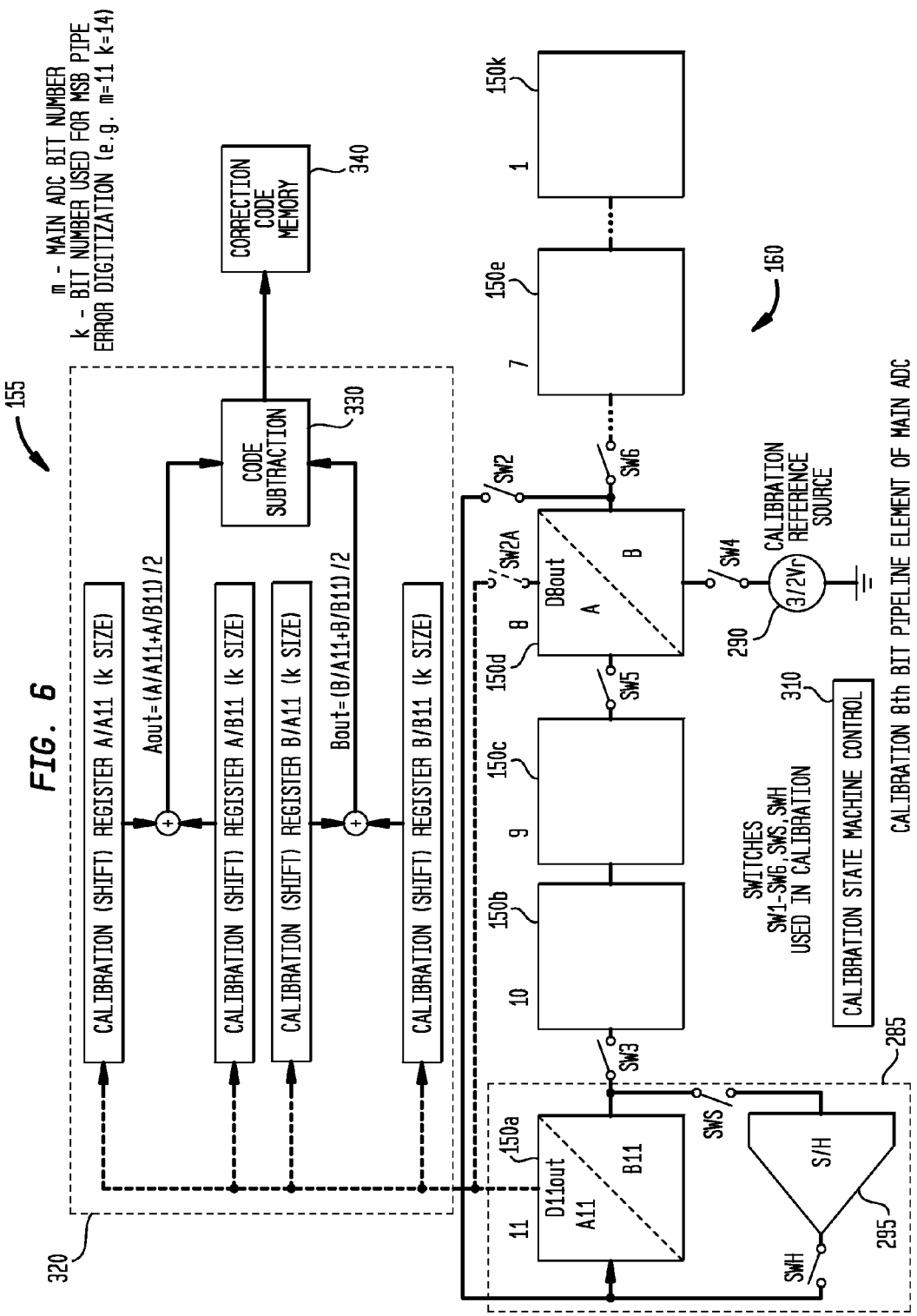
FIG. 6 shows one embodiment of calibration circuit 160 of pipeline ADC 155.

Referring now to FIGS. 5 and 6, it is to be understood that each of single pipeline element circuits 150 shown therein is but one of a plurality of similar pipeline element circuits in a pipeline ADC, where the pipeline element circuits are each configured to provide analog voltages and digital representations corresponding to one bit from among a plurality of pipeline element circuits and corresponding bits, and where the plurality of bits form a digital word output by the pipeline ADC. In addition, and continuing to refer to both FIGS. 5 and 6, all details of the digital circuitry associated with pipeline element circuits 150 are not shown in such Figures to avoid obscuring the analog circuitry elements of circuits 150. For example, the standard digital outputs provided by comparators 170 and 180 to the individual registers associated therewith are not shown in FIG. 5, as those skilled in the art of pipeline ADC architecture will understand and appreciate immediately. Moreover, input voltage Vin shown in FIG. 5 is provided by a data acquisition sample-and-hold circuit (not shown in the Figures). This is true, however, only for the first pipeline element circuit 150a shown in FIG. 6; the remaining pipeline element circuits 150b through 150k receive as inputs thereto the outputs provided by preceding pipeline element circuits. Moreover, not all portions of ADC 155 are shown the Figures, as those skilled in the art will understand and appreciate.

In FIG. 5, single pipeline element circuit 150 forms a portion of pipeline ADC 155 (not shown in its entirety in FIG. 6), and features capacitor mismatch error averaging capability. Note that further details concerning the operation of circuit 150 shown in FIG. 5 are to be found in the '318 patent application, incorporated by reference in its entirety above. As described in the '318 patent application, circuit 150 permits the functionality of capacitors C1 (capacitor A) and C2 (capacitor B) to be exchanged during a multiplication phase. By closing switches $\phi_{2A}$, capacitor C2 (capacitor B) is connected to the negative feedback loop of amplifier 240 while capacitor C1 (capacitor A) is connected to one of reference voltages Vr, 0, Vr, depending on the value of D selected by the multiplexer (which in turn is based on the input signal magnitudes detected by comparators 170 and 180). Such a connection configuration for circuit 150 is referred to herein as phase 2A. During a multiplication phase (phase 2B), switches $\phi_{2B}$ connect capacitor C1 (capacitor A)$_1$ to the negative feedback loop of amplifier 240 while capacitor C2 (capacitor B) connected to one of reference voltages −Vr, 0, Vr through multiplexer 190.

The signal transformation associated with the operation of pipeline element circuit 150 in FIG. 5 during phase 2A and phase 2B configurations is expressed as follows:

$$V_{outA} = V_{in}(\delta + 2) - DV_r(\delta + 1) \quad (1A)$$

$$V_{outB} = V_{in}\frac{\delta + 2}{\delta + 1} - DV_r\frac{1}{(\delta + 1)} \quad (1B)$$

where the mismatch in capacitances of capacitors C1 (capacitor A) and C2 (capacitor B) values is described by introducing a capacitance mismatch parameter $\delta$ as follows:

$$\frac{C_1 - C_2}{C_2} = \delta \quad (2)$$

Figure 7:
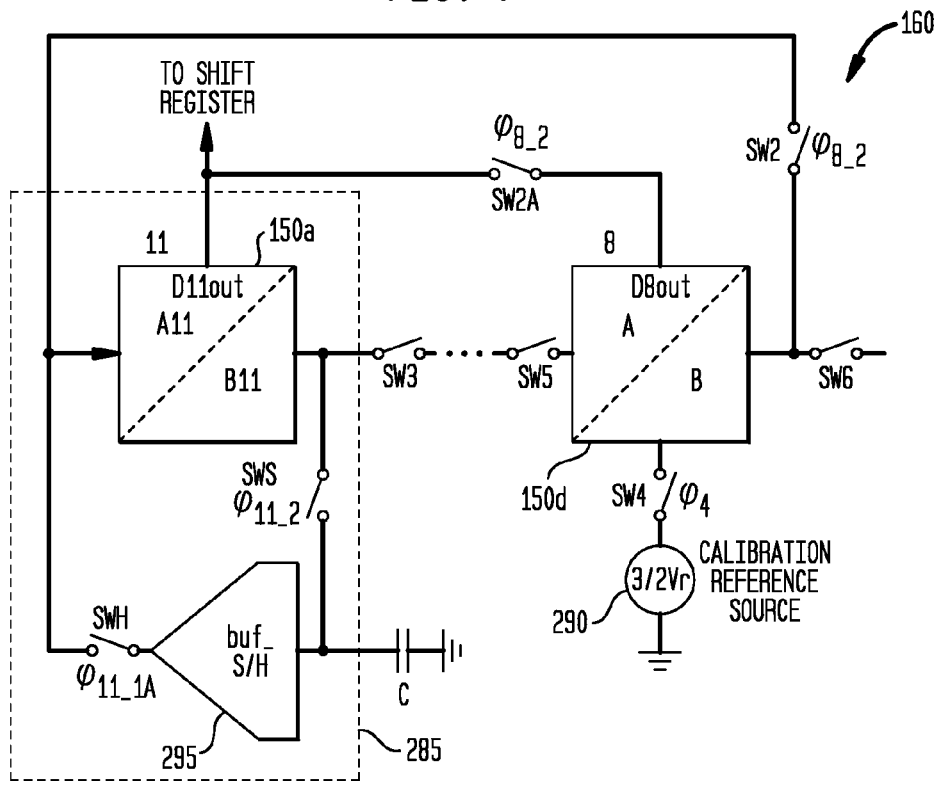
FIG. 7 shows one embodiment of digitizer circuit 285.

The numeric value D described above corresponds to the input signal value $V_{in}$ detected by comparators 170 and 180, and may be expressed as:

$D=1$, if $Vin>Vref>-Vref$ $D=0$, if $Vref>Vin>-Vref$ $D=-1$, if $Vin<-Vref<Vref$ FIG. 6 shows a block diagram of a calibration circuit 160, which is configured to calibrate pipeline element circuit 8 (150d) of an 11-bit ADC 155. The principle of operation for calibration circuit 160 described below is similar for each of pipeline element circuits 150a through 150k of ADC 155, including first pipeline element circuit 11 (150a) shown in FIG. 6. FIG. 7 shows digitizer circuit 285 together with supporting switches and switch controls separate from the rest of circuit 160 of FIG. 5. The control signal protocol that supports the calibration circuitry and operations illustrated in FIGS. 6 and 7 is shown in FIG. 8.

During the calibration phase, calibration reference voltage source 290 is connected to the input of the pipeline element circuit being calibrated while such pipeline element circuit is configured for phase 2A operation. Further during the calibration phase, the pipeline element circuit being calibrated is disconnected from adjoining pipeline circuit element elements of ADC 155. The magnitude of the voltage provided by calibration reference voltage source 290, which according to one embodiment is set at 3/2Vr as shown in FIG. 6, should be selected such that the pipeline element circuit being calibrated provides a digital output corresponding to its most significant bit at a high logical level. The analog output of the pipeline element circuit being calibrated is then fed into a most significant bit pipeline element input of ADC 155, where pipeline element circuit 150a (11) performs the digitization process, and the digital output corresponding to the pipeline element circuit being calibrated is fed into output shift register and summing circuit 320. After the residual analog signal of the pipeline circuit element being calibrated is passed to digitizer circuit 285, the pipeline circuit element is disconnected from remainder of circuit 160.

Digitizer circuit 285 (which includes pipeline element circuit 150a for the most significant 11th bit and sample-and-hold circuit 295) is configured to operate in multiplication phase 2A with sample and hold circuit 295 connected to the output of digitizer circuit 285, which stores the residual analog signal of the digitizer circuit's multiplication phase. When digitizer circuit 285 is then switched to operate in an acquisition phase (not to be confused with ADC 155 operating in a normal analog signal acquisition and conversion phase after capacitor mismatch error calibration has been completed), the residual analog signal in sample and hold circuit 295 from the previous digitizer circuit 285's processing cycle is provided to the input of digitizer circuit 285 from sample and hold circuit 295 as shown in FIG. 7.

Figure 8:
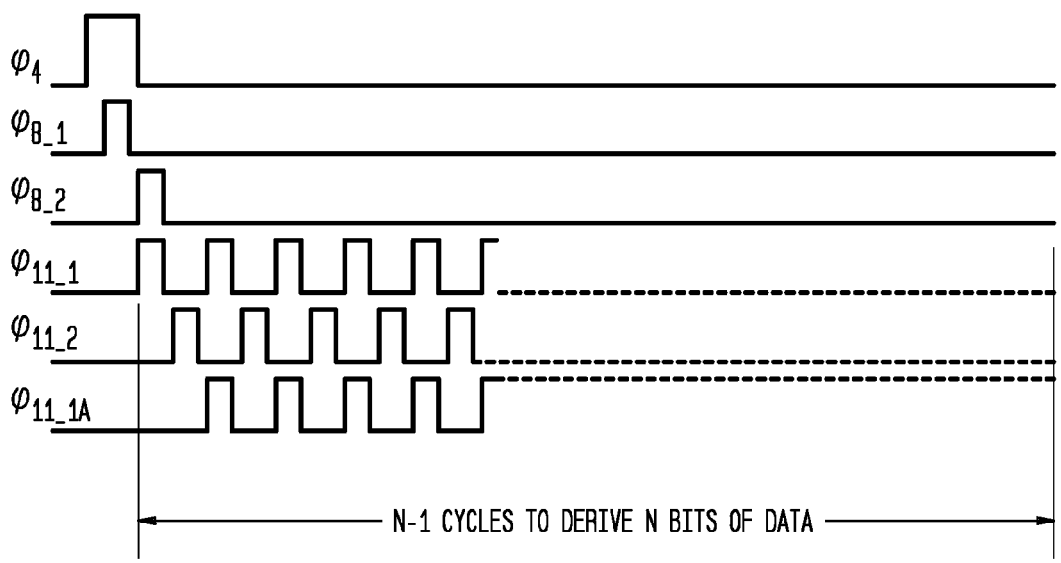
FIG. 8 shows one embodiment of a control signal protocol for digitizer circuit 285 of FIG. 7.

The control calibration protocol shown in FIG. 8 assumes that the switches of FIG. 8 are normally open so that a high state of the control signal closes the switches. The digital result of one bit digitization provided by digitizer circuit 285 is then converted into binary code and provided to shift register A/A11 of FIG. 6. Such conversion allows more bits of data to be stored in comparison to the binary bit number of the main ADC conversion code.

Upon completing the digitization cycle for the pipeline element circuit being calibrated with the specified bit number delivered by digitizer circuit 285, the collection of data into register A/A11 is terminated. The digitization cycle is then repeated by digitizer circuit 285 operating in phase 2B while the pipeline element circuit being calibrated remains in a phase 2A configuration. Digitization data are then provided to register A/B11 by digitizer circuit 285, where the same digitization cycle length is employed as in the case of register A/A11.

Applying the transfer function for the pipeline element circuit shown in expression 1A above to the digitization of the 8th bit pipeline element error $\delta_8$, where the 8th element is used as the first element of the digitization chain, and further assuming digitizer circuit 285 is configured for operation in phase 2A using the reference source voltage code in counts may be expressed as:

$$N_{countA/A_{11}} =$$
$$D_k 2(\delta_8+1)\delta_{11}+2)^{k-2}+$$
$$D_{k-1}2(\delta_{11}+2)^{k-3}+$$
$$D_{k-2}2(\delta_{11}+2)^{k-4}+$$
$$\ldots$$
$$D_3 2(\delta_{11}+2)+$$
$$D_2 2+$$
$$D_1 \qquad (2A)$$

where $N_{countA/A11}$ is a variable the integer number of which represents the kth bit digital conversion code for the calibration source, $\delta_8$ and $\delta_{11}$ are capacitor mismatches in the 8th bit pipeline element circuit, and digitizer circuit 285. Similarly, using expression 1B above the conversion code for the calibration source $N_{countA/B11}$ may be expressed as follows:

$$N_{countA/B11} = D_k 2(\delta_8+1)\frac{(\delta_{11}+2)^{k-2}}{(\delta_{11}+1)^{k-2}} + D_{k-1}\frac{2(\delta_{11}+2)^{k-3}}{(\delta_{11}+1)^{k-3}} + \qquad (2B)$$
$$D_{k-2}\frac{2(\delta_{11}+2)^{k-4}}{(\delta_{11}+1)^{k-4}} + \ldots D_3\frac{2(\delta_{11}+2)}{(\delta_{11}+1)} + D_2 2 + D_1$$

Taking the count average of the codes stored in registers A/A11 and A/B11 the following result is obtained:

$$\langle N_{A\_8}\rangle = \frac{N_{countA/A_{11}}+N_{countA/B_{11}}}{2} = \qquad (3)$$
$$D_k(\delta_8+1)\left((\delta_{11}+2)^{k-2}+\frac{(\delta_{11}+2)^{k-2}}{(\delta_{11}+1)^{k-2}}\right)$$
$$D_{k-1}\left((\delta_{11}+2)^{k-3}+\frac{(\delta_{11}+2)^{k-3}}{(\delta_{11}+1)^{k-3}}\right)$$
$$D_{k-2}\left((\delta_{11}+2)^{k-4}+\frac{(\delta_{11}+2)^{k-4}}{(\delta_{11}+1)^{k-4}}\right)$$
$$\ldots$$
$$D_3\left((\delta_{11}+2)+\frac{(\delta_{11}+2)}{(\delta_{11}+1)}\right)D_2 2 + D_1$$

In similar fashion, the calibration procedure employed for the same pipeline element circuit being calibrated is repeated with pipeline element circuit configured to operate in phase 2B during the multiplication phase. The corresponding generated digital error codes are then stored in registers B/A11 and B/B11, and the following averaged count representation is obtained:

$$\langle N_{B\_8}\rangle = \qquad (4)$$
$$\frac{N_{countB/A_{11}}+N_{countB/B_{11}}}{2}D_k\frac{1}{(\delta_8+1)}\left((\delta_{11}+2)^{k-2}+\frac{(\delta_{11}+2)^{k-2}}{(\delta_{11}+1)^{k-2}}\right)$$
$$D_{k-1}\left((\delta_{11}+2)^{k-3}+\frac{(\delta_{11}+2)^{k-3}}{(\delta_{11}+1)^{k-3}}\right)$$
$$D_{k-2}\left((\delta_{11}+2)^{k-4}+\frac{(\delta_{11}+2)^{k-4}}{(\delta_{11}+1)^{k-4}}\right)$$
$$\ldots$$
$$D_3\left((\delta_{11}+2)+\frac{(\delta_{11}+2)}{(\delta_{11}+1)}\right)D_2 2 + D_1$$

Owing to the difference of the most significant bit weights in expressions 3 and 4, the digital state sets of $D_k$-$D_1$ corresponding to expressions 3 and 4 are different. Assuming small values of $\delta_8$ and $\delta_{11}$, an estimation of the calibration code count multiplied by 2 is obtained by taking the difference of the most significant bit weights of expressions 3 and 4:

$$2N_{cor8} = \langle N_{A\_8}\rangle - \langle N_{B\_8}\rangle \cong \qquad (5)$$
$$2\delta_8\left((\delta_{11}+2)^{k-2}+\frac{(\delta_{11}+2)^{k-2}}{(\delta_{11}+1)^{k-2}}\right)\delta_8 2^k\left(1+\frac{\delta_{11}^2(k-1)(k-2)}{2^3}\right)$$

It follows from expression 5 that with a sufficient number of bits provided by the output of digitizer circuit 285 an accurate digital representation of the capacitance mismatches of the pipeline element circuits 150*a* through 150*k* is obtained using digital code A and B differences for any pipeline element circuit configured to operate in phase 2A and phase 2B. Expression 5 further shows that any inaccuracy in digitizer circuit 285 in substantially suppressed by averaging the digital codes obtained during the A and B modes of operation for digitizer circuit 285 itself.

Digital correction codes for individual pipeline element circuits obtained as differences of A and B calibration codes are stored as shown in FIG. 6, and may be obtained using constant or variable digitization bit numbers.

Figure 9:
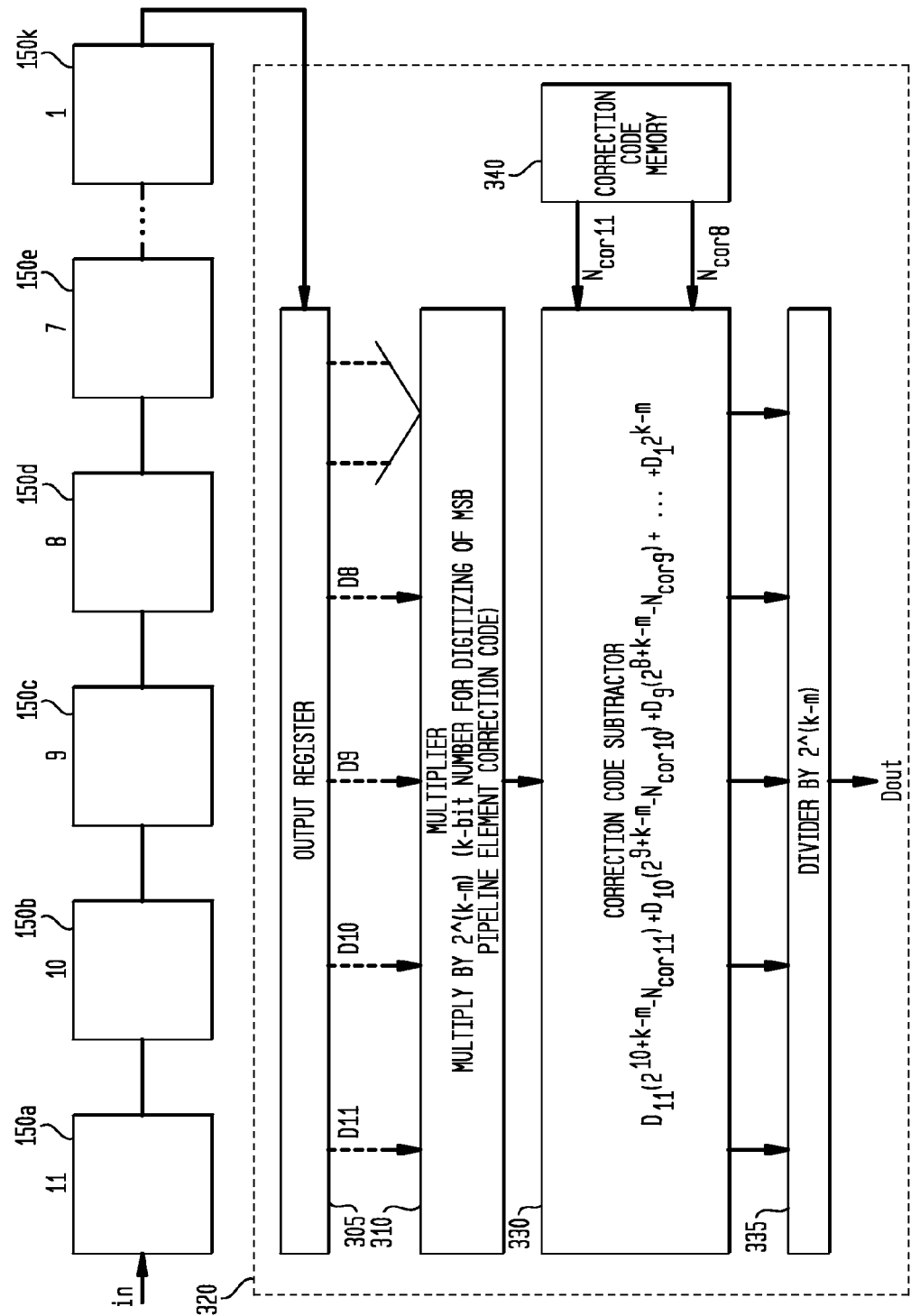
FIG. 9 shows one embodiment of pipeline element circuits 150a through 150k and output register and summing circuit 320.

FIG. 9 shows a block diagram of pipeline element circuits 150*a* through 150*k* of pipeline ADC 155 with raw conversion code correction during each main ADC analog signal conversion cycle. Raw conversion codes are multiplied by 2 to powers representing differences between error digitization bit numbers and main ADC conversion code bit numbers. The correction code vector is subtracted from the result of the foregoing multiplication process. If the correction codes provided by digitizer circuit 285 are determined to have constant bit numbers, then prior to subtraction each component of the correction vector must be divided by 2 according to the power of difference between the constant bit number of digitizer circuit 285 and the bit number of the pipeline element circuit being corrected. The result of the subtraction of the correction code vector is then divided by 2 according to the power of the difference between the error digitization bit number and the main ADC conversion code bit number. The result of the foregoing division process is then presented to the output as the corrected ADC conversion code. The raw code correction illustrated in FIG. 9 is an example corresponding to an 11 bit main ADC. The correction coefficient used for subtraction should correspond to the bit number of the binary weight coefficient of the raw code from which it is subtracted.

Figure 10:
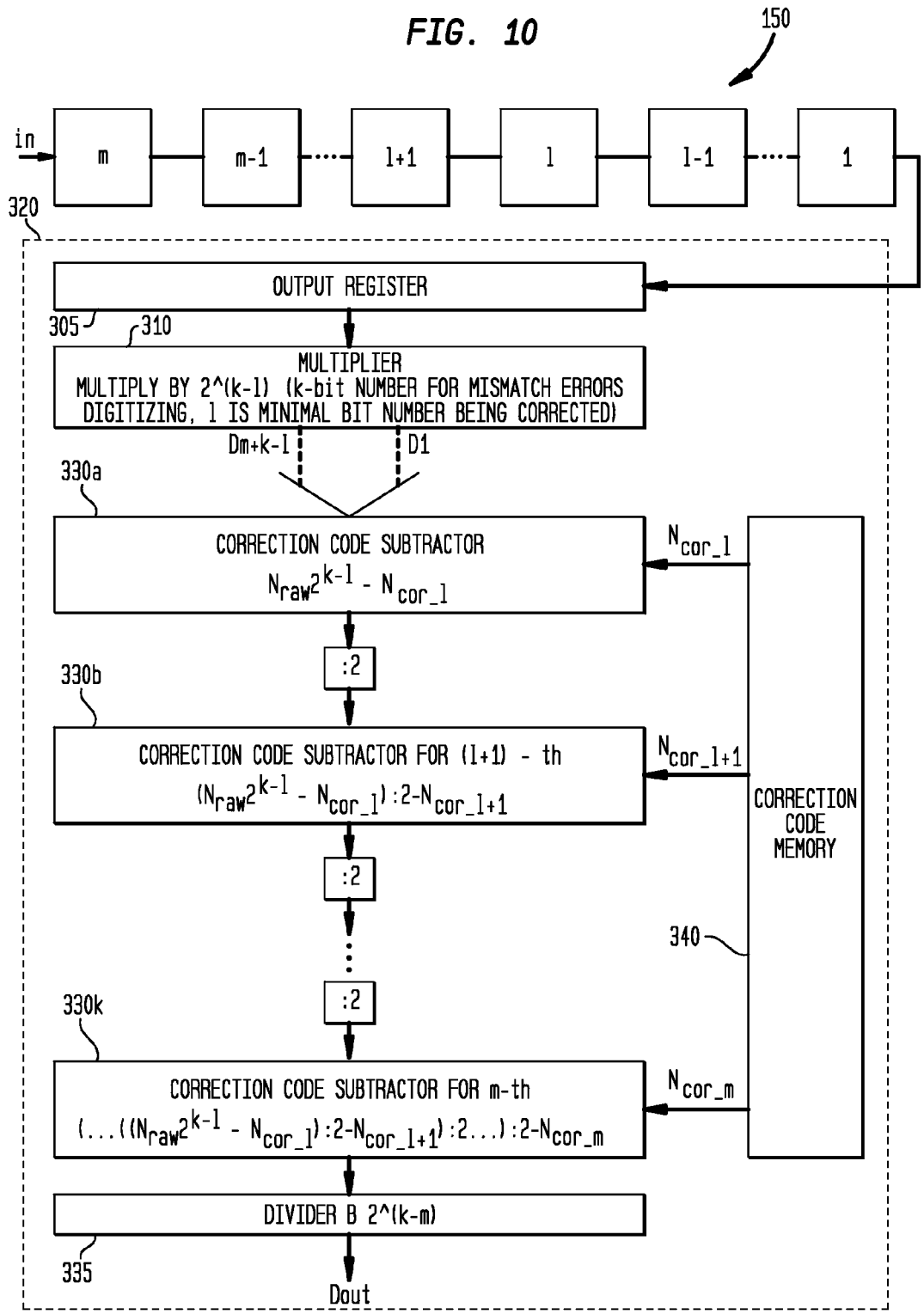
FIG. 10 shows another embodiment of pipeline element circuits 1 through m and output register and summing circuit 320.

A more elaborate method and circuit for the correction of coefficients post-processing is shown in FIG. 10, which preserves the accuracy of digitizer circuit 285 and provides higher resolution mismatch error estimations than the embodiment shown in FIG. 9. As illustrated in FIG. 10, raw codes are first multiplied by 2 according to the power of the difference between the number of bits provided by digitizer circuit 285 and the corresponding bit number for the lowest-bit pipeline element circuit where capacitor mismatch errors are to be corrected. Correction codes are subtracted one by one and the result divided by 2 after each subtraction to provide an input code for the correction of upper level pipeline element circuit bits.

Figure 11A:
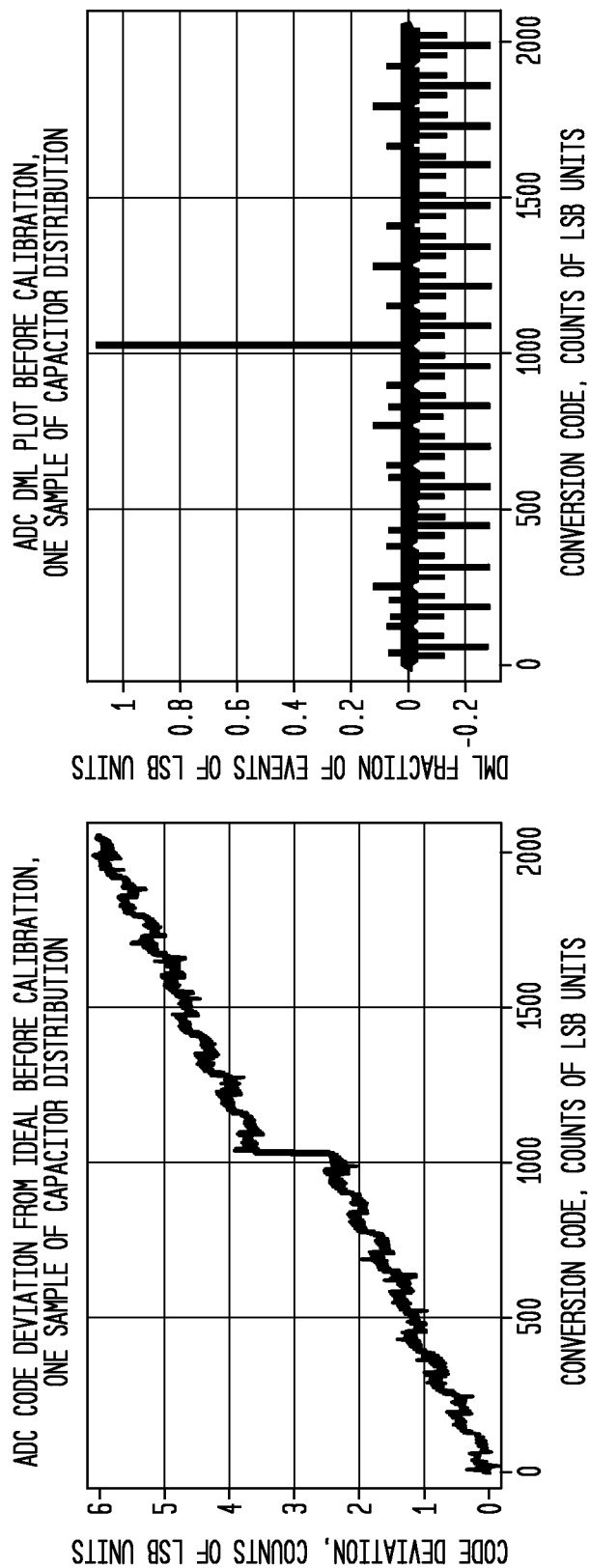
FIGS. 11(a) through 11(c) show simulated deviations from an ideal ADC conversion function caused by capacitor mismatches using error correction codes.
Figure 11B:
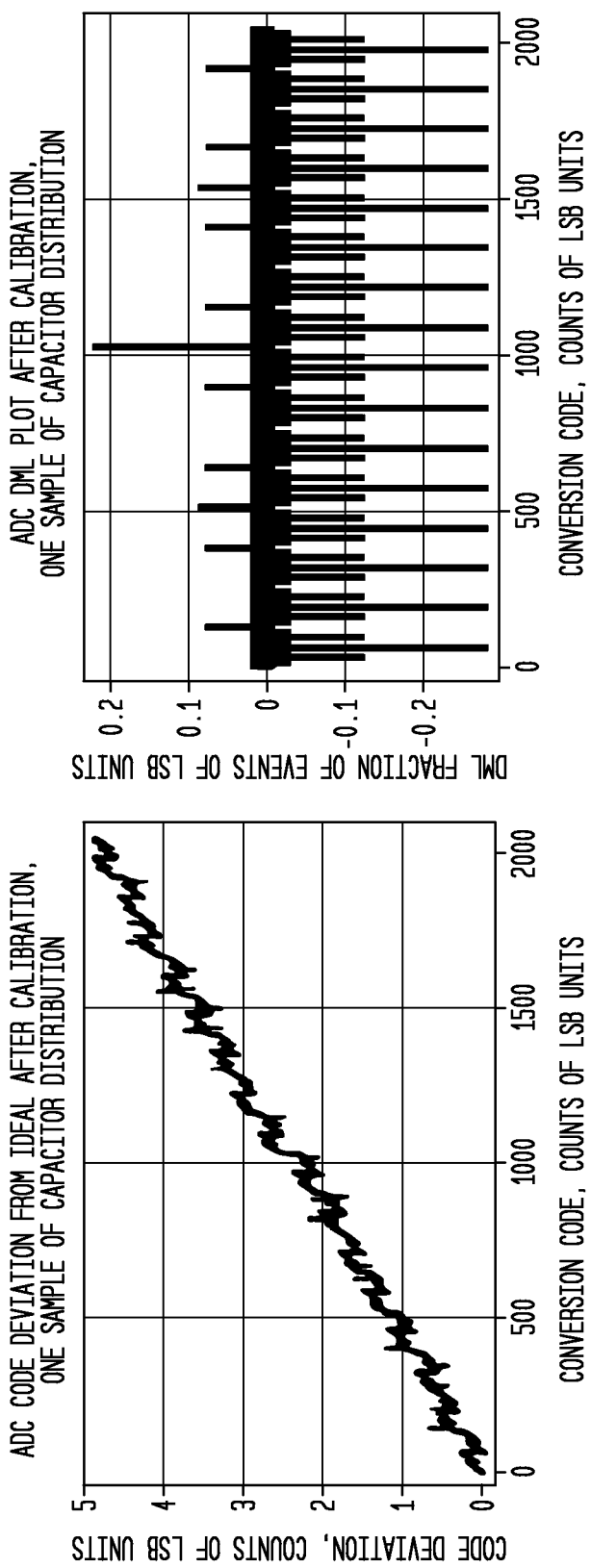
Figure 11C:
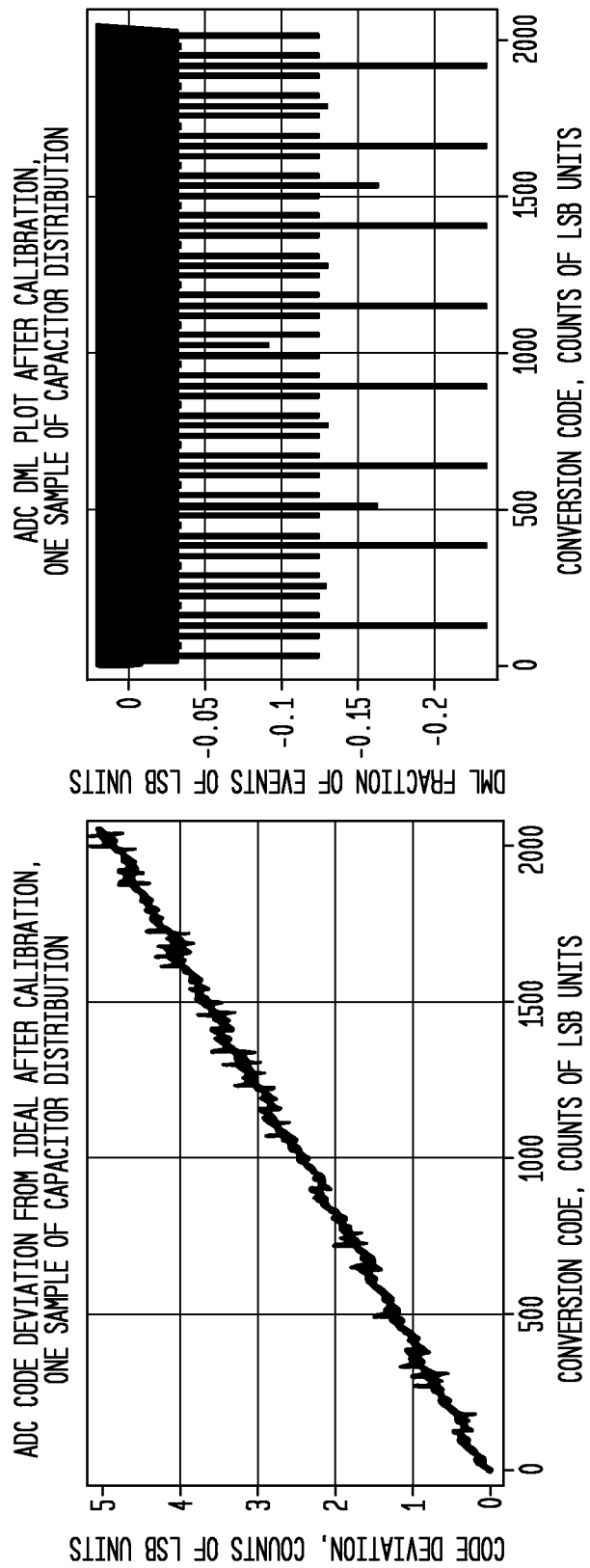

FIGS. 11(a) through 11(c) shows simulated main ADC transfer function corrections obtained using the above-described digitization and capacitor mismatch error correction methods and circuits. Errors in pipeline element circuits prior to calibration (FIG. 11(a), after 4 bits have been calibrated (FIG. 11(b)), and after 5 bits have been calibrated (FIG. 11(c)) for ADC 155 were digitized, followed by the correction of the raw conversion codes. Foundry test structure data corresponding to capacitor mismatches for given capacitor sizes were used in the simulated pipeline ADC design and performance.

Figure 12A:
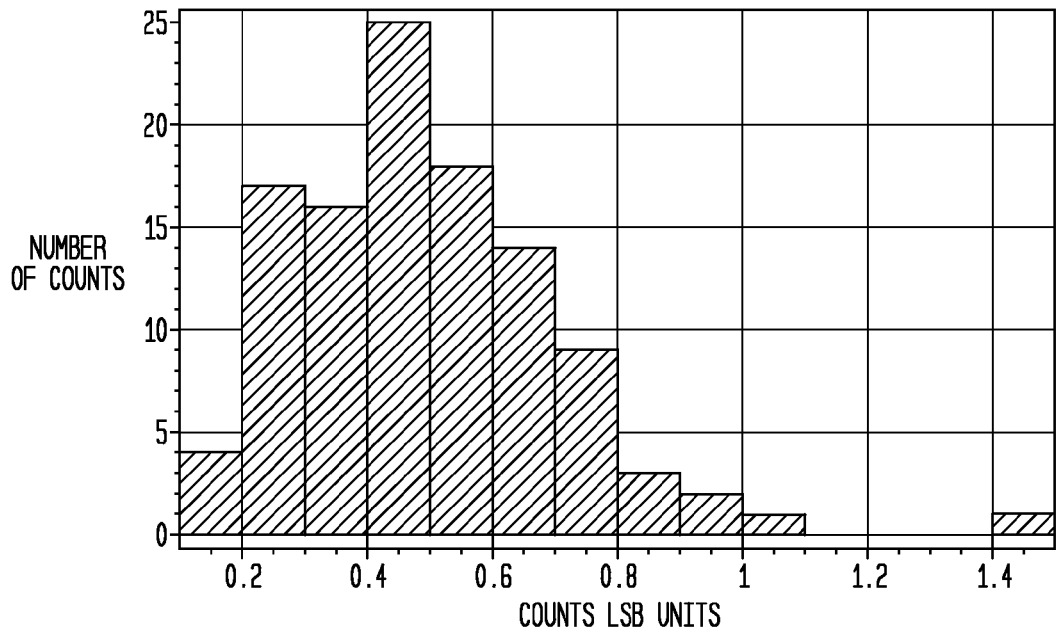
FIGS. 12(a) and 12(b) show histogram results of deviations from an ideal ADC conversion function for non-calibrated and calibrated ADCs.
Figure 12B:
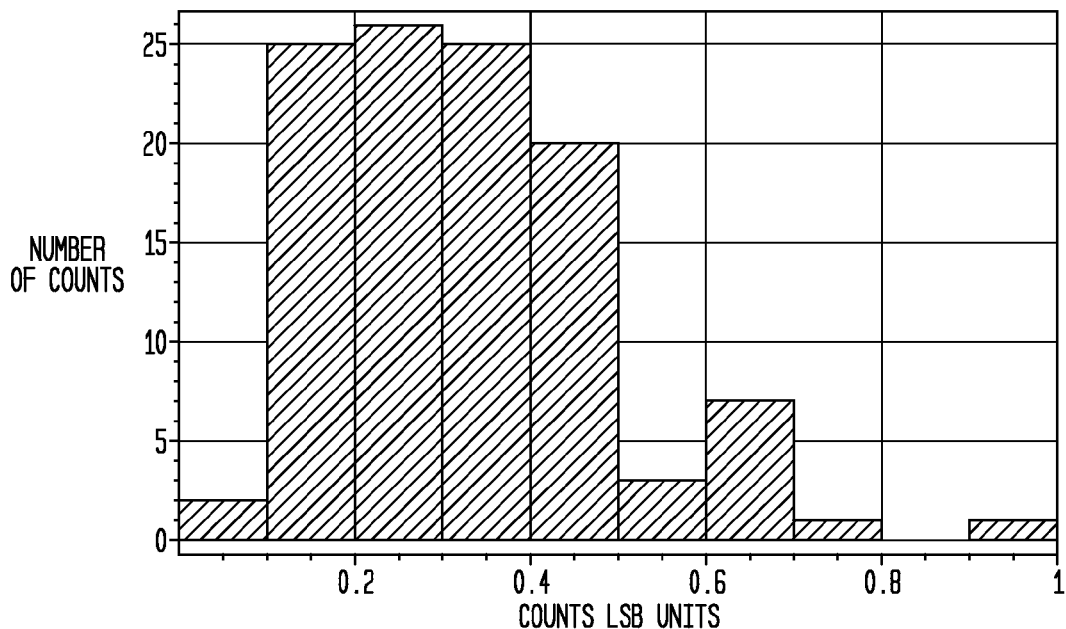

FIGS. 12(a) and 12(b) show simulated ADC performance in relation to the absolute deviation of conversion functions from a linear fit simulated for ADC 155 having capacitor mismatch distributions corresponding to the histograms of FIG. 14. The comparisons shown in FIGS. 12(a) and 12(b) correspond to ADC conversion functions with and without calibration for the 5 most significant bits.

Figure 13:
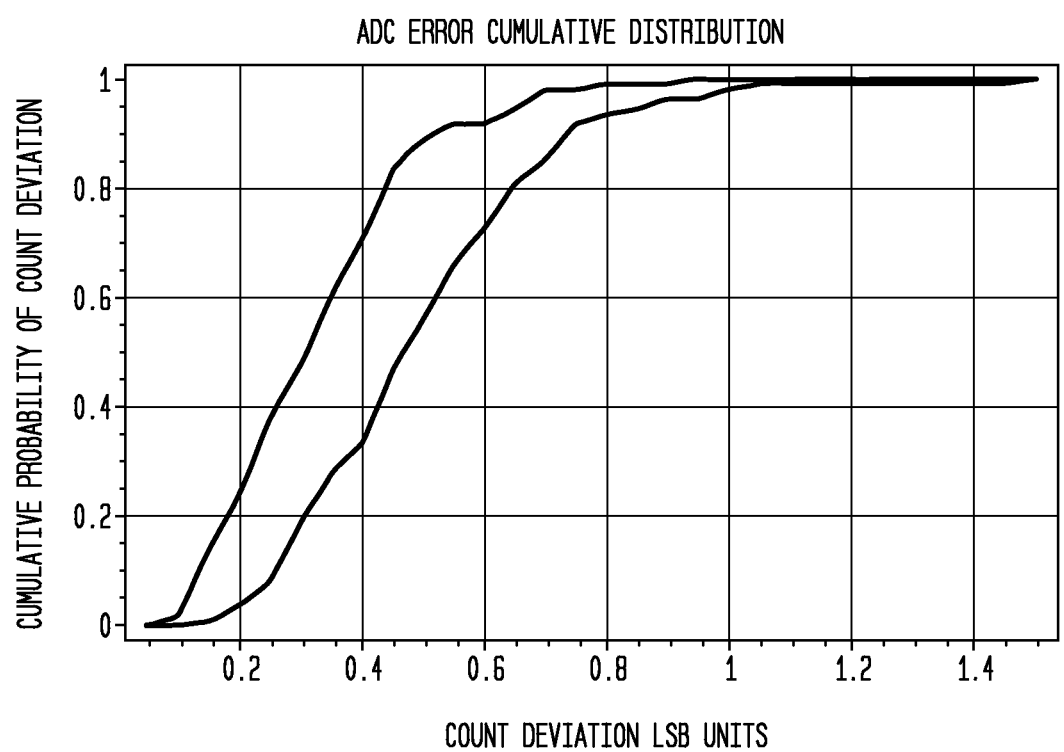
FIG. 13 shows simulated cumulative distributions of ADC conversion errors for non-calibrated and calibrated ADCs.

FIG. 13 shows the resulting cumulative distribution of results obtained in FIGS. 12(a) and 12(b) for the maximum deviation of ADC conversion functions from a linear fit for non-calibrated and the 5 most significant bit calibrated ADC conversion functions using a 14-bit digitizer.

FIG. 14 shows simulated histograms obtained with a 14-bit digitizer, where foundry-provided capacitor mismatch error data were employed for different capacitors in 4 pipeline element circuits of a simulated ADC design.

Referring now to FIGS. 5 through 14, it will be seen that there are described herein various embodiments of pipeline ADC 155 comprising a plurality of pipeline element circuits 150a through 150k, where each pipeline element circuit corresponds to a given bit of pipeline ADC 155. Each pipeline element circuit 150 comprises an amplifier circuit 150 switchably configured to operate in first A and second B capacitor configurations corresponding, respectively, to a first A capacitor (C1) and a second B capacitor (C2). The first pipeline element circuit (150a) comprises a calibration sample-and-hold circuit 295 operably connected thereto, and the first pipeline element circuit 150a is configured to digitize analog A and B capacitor mismatch error calibration voltages generated by the first pipeline element circuit 150a and by the remainder of the pipeline element circuits 150b through 150k when pipeline ADC 155 is operating in a capacitor mismatch calibration phase. The first pipeline element circuit 150a is further configured to provide as outputs therefrom digital representations corresponding to the A and B capacitor mismatch error calibration voltages for each of the plurality of individual pipeline element circuits 150a through 150k during the capacitor mismatch calibration phase. Output shift register and summing circuit 320 is configured to receive and process the digital representations to provide capacitor mismatch error correction codes corresponding to each bit and pipeline element circuit. Correction code memory 340 may form a portion or not form a portion of pipeline ADC 155, and is configured to receive and store therein the capacitor mismatch error correction codes corresponding to each bit and pipeline element circuit of pipeline ADC 155. The resulting capacitor mismatch error correction codes are applied to each bit weight of pipeline ADC 155 after conversion of analog signals input to pipeline ADC 155 has been completed.

Furthermore, each pipeline element circuit 150 is operably connected to a calibration reference voltage source during the calibration phase. As shown in FIG. 6, operation of individual pipeline element circuits 150a through 150k may be controlled by calibration state machine 310 during the calibration phase. In addition, during the calibration phase A capacitor mismatch error voltages for each pipeline element circuit 150a through 150k may be provided to the first pipeline element circuit 150a for digitization thereby, followed by B capacitor mismatch error voltages for each pipeline element circuit 150a through 150k being provided to the first pipeline element circuit 150a for digitization thereby. Output shift register and summing circuit 320 may be configured to average the digital representations corresponding to each pipeline element circuit 150a through 150k when computing the capacitor mismatch error correction codes. During conversion of analog signals input to the ADC, and after the calibration phase has been completed, a data acquisition sample-and-hold circuit may be configured to provide an input voltage to the first pipeline element circuit 150a during a data acquisition phase. Pipeline ADC 150 may form a portion of a CMOS integrated circuit, a touchscreen or touchpad controller, and may further be incorporated into a touchscreen device, a touch panel device, a mobile phone or an imaging device.

Continuing to refer to FIGS. 5 through 14, it will now also be seen that there are described herein various embodiments of methods for reducing capacitor mismatch errors in pipeline ADC 155, where capacitor mismatch error calibration voltages generated by the pipeline element circuits 150a through 150k are digitized, digital representations corresponding to the A and B capacitor mismatch error calibration voltages are generated for each of pipeline element circuits 150a through 150k, and the digital representations are provided to output shift register and summing circuit 320 where A and B capacitor mismatch error correction codes corresponding to each bit and pipeline element circuit 150a through 150k are then generated.

Such methods may further include storing in a correction code memory 340 the A and B capacitor mismatch error correction codes for subsequent application to each corresponding bit of pipeline ADC 155, applying the A and B capacitor mismatch error correction codes corresponding to each bit and pipeline element circuit 150a through 150k to the individual corresponding bit weights of pipeline ADC 155 after conversion of analog signals input to the pipeline ADC 155 has been completed.

Such methods may still further include operably connecting each pipeline element circuit 150a through 150k to at least one calibration reference voltage source 290 during the calibration phase, operating pipeline element circuits 150a through 150k under the control of calibration state machine 310 during the calibration phase, providing during the calibration phase A capacitor mismatch error voltages for each pipeline element circuit 150a through 150k to the first pipeline element circuit 150a for digitization thereby, followed by providing B capacitor mismatch error voltages for each pipeline element circuit 150a through 150k to the first pipeline element circuit 150a for digitization thereby. Each pipeline element circuit 150a through 150k is switchably disconnected from adjoining pipeline element circuits when the A and B capacitor mismatch error voltages corresponding thereto are generated during the calibration phase. The digital representations are provided to output register and summing circuits 320 for each pipeline element circuit 150a through 150k when computing capacitor mismatch error correction codes.

Note further that output register and summing circuits 320 may be located outside ADC 155, as may correction code memory 340.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

I claim:

1. A pipeline analog-to-digital converter (ADC), comprising:
    a plurality of pipeline element circuits, each pipeline element circuit corresponding to a given bit of the pipeline ADC and comprising an amplifier circuit switchably configured to operate in first A and second B capacitor configurations corresponding, respectively, to a first A capacitor and a second B capacitor, a first pipeline element circuit comprising a calibration sample-and-hold circuit operably connected thereto, the first pipeline element circuit being configured to digitize analog A and B capacitor mismatch error calibration voltages generated by the first pipeline element circuit and by the remainder of the pipeline element circuits when the pipeline ADC is operating in a capacitor mismatch calibration phase, the first pipeline element circuit further being configured to provide as outputs therefrom digital representations corresponding to the A and B capacitor mismatch error calibration voltages for each of the plurality of pipeline element circuits during the capacitor mismatch calibration phase;
    an output shift register and summing circuit configured to receive and process the digital representations to provide capacitor mismatch error correction codes corresponding to each bit and pipeline element circuit, and
    a memory one of forming a portion of and not forming a portion of the pipeline ADC configured to receive and store therein the capacitor mismatch error correction codes corresponding to each bit and pipeline element circuit of the pipeline ADC;
    wherein the capacitor mismatch error correction codes are applied to each bit weight of the pipeline ADC after conversion of analog signals input to the pipeline ADC has been completed.

2. The pipeline ADC of claim 1, wherein each pipeline element circuit is operably connected to a calibration reference voltage source during the calibration phase.

3. The pipeline ADC of claim 1, wherein operation of the pipeline element circuits is controlled by a calibration state machine during the calibration phase.

4. The pipeline ADC of claim 1, wherein during the calibration phase A capacitor mismatch error voltages for each pipeline element circuit are provided to the first pipeline element circuit for digitization thereby, followed by B capacitor mismatch error voltages for each pipeline element circuit being provided to the first pipeline element circuit for digitization thereby.

5. The pipeline ADC of claim 1, wherein each pipeline element circuit is switchably disconnected from adjoining pipeline element circuits when the A and B capacitor mismatch error voltages corresponding thereto are generated during the calibration phase.

6. The pipeline ADC of claim 1, wherein the output shift register and summing circuit is configured to average the digital representations corresponding to each pipeline element circuit when computing the capacitor mismatch error correction codes.

7. The pipeline ADC of claim 1, further comprising a data acquisition sample-and-hold circuit configured to provide an input voltage to the first pipeline element circuit during a data acquisition phase.

8. The pipeline ADC of claim 7, wherein each pipeline element circuit comprises a first comparator comprising a first negative input terminal operably connected to a first reference voltage and a first positive input terminal operably connected to the input voltage, the first comparator providing a first comparator output, a second comparator comprising a second negative input terminal operably connected to a second reference voltage and a second positive input terminal operably connected to the input voltage, the second comparator providing a second comparator output.

9. The pipeline ADC of claim 8, wherein each pipeline element circuit further comprises a multiplexer configured to receive as inputs thereto the first comparator output, the second comparator output, the first reference voltage, the second reference voltage, and ground, the multiplexer providing a multiplexer output representative of one of the first reference voltage, the second reference voltage, and ground, the multiplexer output being provided in accordance with the outputs provided by the first and second comparators.

10. The pipeline ADC of claim 9, wherein the amplifier circuit of each pipeline element circuit is configured to receive the input voltage and the multiplexer output as inputs thereto, the amplifier circuit of each pipeline element circuit further comprising an amplifier having an output and positive and negative amplifier inputs, the positive amplifier input being connected to ground, the amplifier circuit further comprising first, second and third sets of switches.

11. The pipeline ADC of claim 10, wherein during a first phase the first set of switches is closed, the second and third sets of switches are open, the first A and second B capacitors are arranged in parallel with respect to one another and are charged up by the input voltage through the first set of switches, during a second phase the first A and second B capacitors are arranged in series respecting one another, the second set of switches is closed and the first and third sets of switches are open, and through the second set of switches the second B capacitor B is placed in a negative feedback loop between the negative amplifier input and the amplifier output, the first A capacitor is charged up by the multiplexer output provided thereto, and a second output voltage representative of the second B capacitance is presented at the amplifier output, during a third phase the first set of switches is closed, the second and third sets of switches are open, the first A and second B capacitors are arranged in parallel with respect to one another and are charged up again by the same input voltage as in the first phase through the first set of switches, and during a fourth phase the first A and second B capacitors are arranged in series respecting one another, the third set of switches is closed and the first and second sets of switches are open, and through the third set of switches the first A capacitor A is placed in the negative feedback loop, the second B capacitor B is charged up by the multiplexer output provided thereto, and a first output voltage representative of the first A capacitance is presented at the amplifier output.

12. The pipeline ADC of claim 11, wherein the first set of switches comprises first, second and third switches, the second set of switches comprises fourth and fifth switches, and the third set of switches comprises sixth and seventh switches.

13. The pipeline ADC of claim 12, wherein during the first phase the first, second and third switches are closed, the fourth, fifth, six and seventh switches are open, the first A capacitor is charged up by the input voltage to a first charge through the first switch on the high side of the first A capacitor and through the third switch to ground on the low side of the first A capacitor, the second B capacitor is charged up by the input voltage to a second charge through the second switch on the high side of the second B capacitor and through the third switch to ground on the low side of the second B capacitor.

14. The pipeline element circuit of claim 12, wherein during the third phase the first, second and third switches are closed, the fourth, fifth, six and seventh switches are open, the first A capacitor is charged up by the input voltage to a first charge through the first switch on the high side of the first A capacitor and through the third switch to ground on the low side of the first A capacitor, the second B capacitor is charged up by the input voltage to a second charge through the second switch on the high side of the second B capacitor and through the third switch to ground on the low side of the second B capacitor.

15. The pipeline ADC of claim 12, wherein during the second phase the first, second, third, sixth and seventh switches are open, the fourth and fifth switches are closed, the second B capacitor is placed in the negative feedback loop between the negative amplifier input and the amplifier output through the fifth switch, and the first A capacitor is charged up by the multiplexer output provided thereto through the fourth switch.

16. The pipeline ADC of claim 12, wherein during the fourth phase the first, second, third, fourth and fifth switches are open, the sixth and seventh switches are closed, the first A capacitor is placed in the negative feedback loop through the seventh switch, and the second B capacitor is charged up by the multiplexer output provided thereto through the sixth switch.

17. The pipeline ADC of claim 12, wherein the data acquisition sample-and-hold circuit provides an updated input voltage during the fourth phase.

18. The pipeline ADC of claim 12, wherein the first and second output voltages are scaled by a scaling factor D.

19. The pipeline ADC of claim 18, wherein the input voltage is Vin, the first reference voltage is Vr, and the second reference voltage is −Vr.

20. The pipeline ADC of claim 19, wherein D=1 when Vin>Vr>−Vr, D=0 when Vr>Vin>−Vr, and D=−1 when Vin<−Vr<Vr.

21. The pipeline ADC of claim 1, wherein the effective number of bits (ENOB) of the pipeline ADC is at least 10.

22. The pipeline ADC of claim 1, wherein the pipeline ADC forms a portion of a CMOS integrated circuit.

23. The pipeline ADC of claim 1, wherein the pipeline ADC forms a portion of a touchscreen or touchpad controller.

24. The pipeline ADC of claim 1, further comprising one of a touchscreen device, a touch panel device, a mobile phone and an imaging device into which the pipeline ADC is incorporated.

25. A method of reducing capacitor mismatch errors in a pipeline analog-to-digital converter (ADC), the pipeline ADC comprising a plurality of pipeline element circuits, each pipeline element circuit corresponding to a given bit of the pipeline ADC and comprising an amplifier circuit switchably configured to operate in first A and second B capacitor configurations corresponding, respectively, to a first A capacitor and a second B capacitor, a first pipeline element circuit comprising a calibration sample-and-hold circuit operably connected thereto, the first pipeline element circuit being configured to digitize analog A and B capacitor mismatch error calibration voltages generated by the first pipeline element circuit and by the remainder of the pipeline element circuits when the pipeline ADC is operating in a capacitor mismatch calibration phase, the first pipeline element circuit further being configured to provide as outputs therefrom digital representations corresponding to the A and B capacitor mismatch error calibration voltages for each of the plurality of pipeline element circuits during the capacitor mismatch calibration phase, the method comprising:

digitizing the A and B analog capacitor mismatch error calibration voltages generated by the individual pipeline element circuits;

generating the digital representations corresponding to the A and B capacitor mismatch error calibration voltages for each of the plurality of pipeline element circuits, and generating A and B capacitor mismatch error correction codes corresponding to each bit and pipeline element circuit.

26. The method of claim 25, wherein the A and B capacitor mismatch error correction codes are generated in an output shift register and summing circuit.

27. The method of claim 25, further comprising storing in a memory the A and B capacitor mismatch error correction codes for subsequent application to each corresponding bit of the pipeline ADC.

28. The method of claim 27, further comprising applying the A and B capacitor mismatch error correction codes corresponding to each bit and pipeline element circuit to the individual corresponding bits of the pipeline ADC after conversion of analog signals input to the pipeline ADC has been completed.

29. The method of claim 25, further comprising operably connecting each pipeline element circuit to at least one calibration reference voltage source during the calibration phase.

30. The method of claim 25, further comprising operating the pipeline element circuits under the control of a calibration state machine during the calibration phase.

31. The method of claim 25, wherein during the calibration phase A capacitor mismatch error voltages for each pipeline element circuit are provided to the first pipeline element circuit for digitization thereby, followed by B capacitor mismatch error voltages for each pipeline element circuit being provided to the first pipeline element circuit for digitization thereby.

32. The method of claim 25, wherein each pipeline element circuit is switchably disconnected from adjoining pipeline element circuits when the A and B capacitor mismatch error voltages corresponding thereto are generated during the calibration phase.

33. The method of claim 25, further comprising averaging the digital representations for each pipeline element circuit when computing the capacitor mismatch error correction codes.

34. The method of claim 25, further comprising including the pipeline ADC in a CMOS integrated circuit.

35. The method of claim 25, further comprising including the pipeline ADC in a touchscreen or touchpad controller.

36. The method of claim 25, further comprising including the pipeline ADC in one of a touchscreen device, a touch panel device, a mobile phone and an imaging device.

\* \* \* \* \*